(12) United States Patent
Kakoee et al.

(10) Patent No.: US 9,484,892 B1
(45) Date of Patent: Nov. 1, 2016

(54) INTEGRATED CIRCUIT ADAPTIVE VOLTAGE SCALING WITH DE-AGING

(71) Applicant: QUALCOMM Incorporated, San Diego, CA (US)

(72) Inventors: Mohammad Reza Kakoee, San Diego, CA (US); Shih-Hsin Jason Hu, San Diego, CA (US); Min Chen, San Marcos, CA (US); Jasmin Smaila Ibrahimovic, San Diego, CA (US); Carlos Auyon, San Diego, CA (US); Sorin Adrian Dobre, San Diego, CA (US); Navid Toosizadeh, San Diego, CA (US); Nan Chen, San Diego, CA (US); Mohamed Waleed Allam, Rancho Santa Fe, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/850,801

(22) Filed: Sep. 10, 2015

(51) Int. Cl.
  *G01R 31/317* (2006.01)
  *H03K 3/011* (2006.01)
  *H03K 3/012* (2006.01)

(52) U.S. Cl.
  CPC ......... *H03K 3/011* (2013.01); *G01R 31/31727* (2013.01); *H03K 3/012* (2013.01)

(58) Field of Classification Search
  CPC . G01R 31/31727; H03K 3/011; H03K 3/012
  See application file for complete search history.

(56) References Cited

U.S. PATENT DOCUMENTS

| | | | |
|---|---|---|---|
| 7,054,787 B2 * | 5/2006 | Gauthier et al. ... | G01R 31/2829 438/17 |
| 7,793,119 B2 | 9/2010 | Gammie et al. | |
| 8,161,431 B2 | 4/2012 | Buonpane et al. | |
| 8,549,363 B2 | 10/2013 | Cher et al. | |
| 8,797,095 B2 | 8/2014 | Moore et al. | |
| 2014/0022008 A1 * | 1/2014 | Noorlag et al. ......... | G06F 1/26 327/540 |
| 2014/0097856 A1 | 4/2014 | Chen et al. | |

* cited by examiner

*Primary Examiner* — Jeffrey Zweizig
(74) *Attorney, Agent, or Firm* — Procopio, Cory, Hargreaves & Savitch LLP

(57) ABSTRACT

An integrated circuit compensates for circuit aging by measuring the aging with an aging sensor and controlling a supply voltage based on the measured aging. The operating environment for the aging sensor can be set to reduce impacts of non-aging effects on the measured aging. For example, the operating environment can use a temperature inversion voltage. An initial aging measurement value which is the difference between an initial aged measurement and an initial unaged measurement can be stored on the integrated circuit. A core power reduction controller can use the measured aging and the stored initial aging measurement value to update a performance-sensor target value and then perform adaptive voltage scaling using the using the updated performance-sensor target value.

28 Claims, 4 Drawing Sheets

INTEGRATED CIRCUIT ADAPTIVE VOLTAGE SCALING WITH DE-AGING

BACKGROUND

1. Field

The present invention relates to integrated circuits and, more particularly, to systems and methods for dynamically de-aging integrated circuit performance.

2. Background

Reducing integrated circuit power consumption has become increasingly important, particularly in battery-powered devices. Reducing the supply voltage can reduce power consumption. The minimum supply voltage needed to operate an integrated circuit can vary based on various conditions such as manufacturing variations, circuit characteristics, temperature, and operational modes of various modules in the integrated circuit. Adaptive voltage scaling (AVS) can be used to control the supply voltage based on sensed performance measures of the integrated circuit.

Device aging, particularly in nanometer technologies, results in degradation of the electrical parameters of an integrated circuit. For example, transistor threshold voltages can be increased by effects such as positive bias temperature instability (PBTI) and negative bias temperature instability (NBTI). Circuits generally operate more slowly with aging. This affects the supply voltage needed to operate the integrated circuit. The rate and amount of aging can vary with the usage of the integrated circuit. For example, a mobile phone may age more when the user uses the phone for multiple tasks such as texting, phone calls, streaming video, and playing games throughout the day compared to a user whose phone is in standby most of the day.

Prior aging compensation schemes estimate a priori the effect of aging on a device. Then, based on a worst-case scenario, aging effects are accounted for by including a large guard band so that the device meets its design requirements if the full effects of aging manifest themselves near the end of the expected operating life of the device. This results in an overly conservative design which can result in significant performance loss. In addition to increased power consumption, reliability can be reduced due to increased temperature.

SUMMARY

In one aspect, a method is provided for compensating for circuit aging in an integrated circuit The method includes: setting an operating environment for an aging sensor disposed on the integrated circuit; measuring the aging sensor at the operating environment to determine a measured aging; updating a target value for a performance sensor using the measured aging and an initial aging measurement value; and performing adaptive voltage scaling using the updated target value In one aspect, an integrated circuit is provided that includes: an aging sensor configured to supply a measured aging; and a core power reduction controller configured to set an operating environment for the aging sensor, receive, from the aging sensor, the measured aging at the operating environment, update a target value for a performance sensor using the measured aging and an initial aging measurement value, and perform adaptive voltage scaling using the updated target value.

In one aspect, an integrated circuit is provided that includes: a means for sensing aging of circuitry in the integrated circuit that supplies a measured aging; and a means for core power reduction configured to set an operating environment for the means for sensing aging, receive, from the means for sensing aging, the measured aging at the operating environment, update a target value for a performance sensor using the measured aging and an initial aging measurement value, and perform adaptive voltage scaling using the updated target value.

Other features and advantages of the present invention should be apparent from the following description which illustrates, by way of example, aspects of the invention.

BRIEF DESCRIPTION OF THE DRAWINGS

The details of the present invention, both as to its structure and operation, may be gleaned in part by study of the accompanying drawings, in which like reference numerals refer to like parts, and in which.

DETAILED DESCRIPTION

The detailed description set forth below, in connection with the accompanying drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in simplified form in order to avoid obscuring such concepts.

Figure 1:
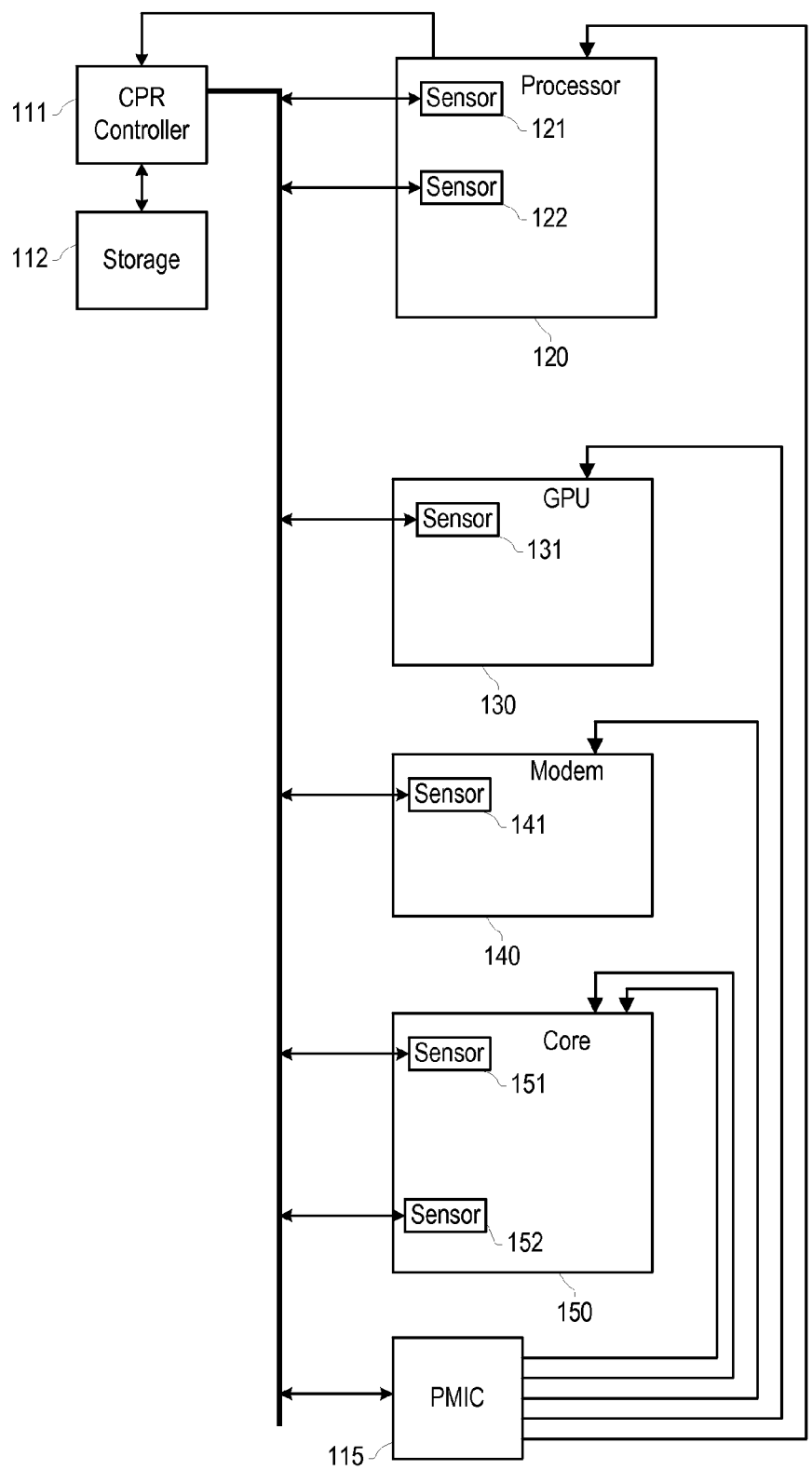
FIG. 1 is a functional block diagram of an electronic system with dynamic de-aging according to a presently disclosed embodiment.

FIG. 1 is a functional block diagram of an electronic system with de-aging according to a presently disclosed embodiment. The system may be implemented using one or multiple integrated circuits. The system may be used, for example, in a mobile phone.

The system includes various modules that perform operational functions for the system. The term operational is used to distinguish functions that may be considered to provide the primary utility of the electronic system from those functions that may be considered ancillary. The example system illustrated in FIG. 1 includes a processor module 120, a graphics processing unit (GPU) 130, a modem module 140, and a core module 150. The processor module 120 can provide general programmable functions; the graphics processing unit 130 can provide graphics functions; the modem module 140 can provide communications functions, for example, wireless communications according to long term evolution (LTE) or code division multiple access (CDMA) protocols; and the core module 150 can provide various functions that are not provided by the other modules.

A core power reduction (CPR) controller 111 provides adaptive voltage scaling for the electronic system. The CPR controller 111 senses characteristics of the circuits and controls supply voltages of the various modules based on the sensed characteristics. The supply voltages are controlled to take into account the effects of circuit aging. The CPR controller 111 may also control operating frequencies of the various modules.

A power management integrated circuit (PMIC) 115 supplies one or more voltages to other modules in the system. The PMIC 115 may include switching-mode power supplies and low-dropout voltage regulators. The PMIC 115 may be a separate integrated circuit. The voltages supplied by the PMIC 115 are controlled by the core power reduction controller 111. Modules of the systems may have one voltage supply or multiple voltages supplies and multiple modules may operate with a common voltage supply. Circuitry operating from a particular voltage supply may be referred to as a supply domain.

The processor module 120, the graphics processing unit 130, the modem module 140, and the core module 150 include performance sensors. In the example system of FIG. 1, the processor module 120 includes two performance sensors 121, 122; the graphics processing unit 130 includes a performance sensor 131; the modem module 140 includes a performance sensor 141; and the core module 150 includes two performance sensors 151, 152. Each of the performance sensors includes circuitry to measure circuit speed. For example, the performance sensors may count oscillations of ring oscillators. The performance sensors measure performance characteristics of circuitry in the sensor. Although the performance of circuitry in an integrated circuit may vary with location, temperature, voltage drop, and other parameters, performance measured by a performance sensor can be used to estimate performance of similar circuitry near the performance sensor.

At least some of the performance sensors include an aging sensor. The aging sensor measures the effect of aging on circuit performance. The aging sensor, in an embodiment, uses the same circuit to measure circuit speeds in both aged and un-aged conditions.

The core power reduction controller 111 may, for example, control the voltages based on an operating mode selected by the processor module 120. The operating mode may include clock frequencies of the modules. The core power reduction controller 111 can determine the supply voltages based on performance measurements from the performance sensors in the corresponding modules and based on aging from the aging sensors. The core power reduction controller 111 may determine a supply voltage so that it equals or only slightly (e.g., 5 mV) exceeds the minimum voltage needed for a selected operating mode. The system may, alternatively or additionally, control other parameters, such as substrate voltage, that affect performance. The core power reduction controller 111 may read values (e.g., baseline aging measurements) from storage 112 for use in determining the supply voltage. Example functions of the core power reduction controller 111 will be further described with reference to the process illustrated in FIG. 7.

Prior systems that do not include dynamic de-aging set the supply voltage to a value that exceeds the minimum voltage needed by a guard band amount. The guard band amount (for example, 50 mV) is used to compensate for the effect of aging (whose magnitude at any given time is not known). Compensation for the effect of aging may, additionally or alternatively, be provided by lowering operating frequencies by guard bands. Compensation for the effect of aging may, additionally or alternatively, be provided by adding guard bands to performance-sensor target values. In prior systems, the amount of guard banding for aging is fixed and applied even at the beginning of operation of the system when no aging has occurred. The de-aging systems and methods described herein eliminate or reduce the performance loss caused by guard banding for the effects of circuit aging.

Figure 2:
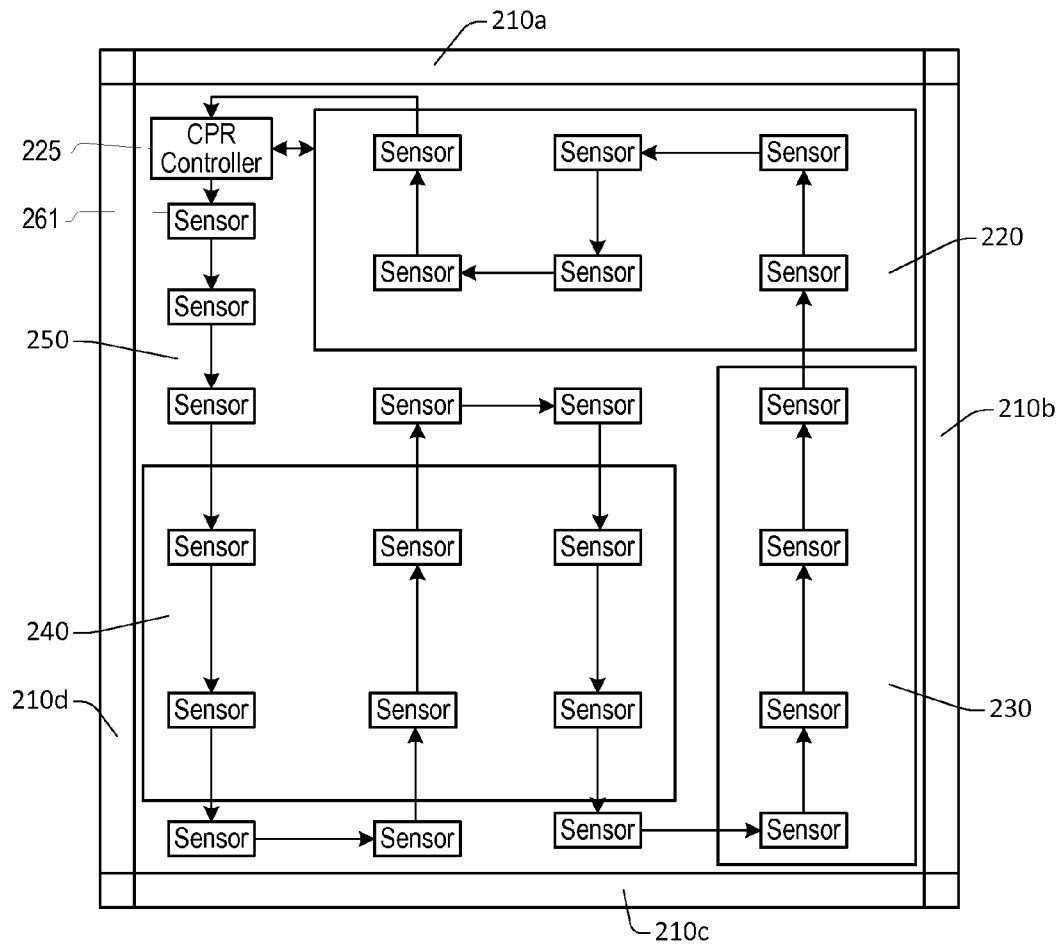
FIG. 2 is a diagram illustrating layout of an integrated circuit with dynamic de-aging according to a presently disclosed embodiment.

FIG. 2 is a diagram illustrating layout of an integrated circuit with de-aging according to a presently disclosed embodiment. The integrated circuit may be used to implement the electronic system of FIG. 1. The integrated circuit may be, for example, fabricated using a complementary metal-oxide-semiconductor (CMOS) process.

The integrated circuit of FIG. 2 includes four periphery blocks 210 (210a, 210b, 210c, and 210d) located along the edges of the integrated circuit. The integrated circuit includes a processor module 220, a graphics processing module 230, and a modem module 240 that are large blocks internal to the integrated circuit. Other functions of the integrated circuit, such as those provided by the core module 150 in the system of FIG. 1, may be spread throughout remaining areas 250 of the integrated circuit. A core power reduction controller 225 (e.g., corresponding to the core power reduction controller 111 and the storage 112 in FIG. 1) may also be implemented in the remaining areas 250 of the integrated circuit.

The integrated circuit also includes performance sensors 261 that are spaced throughout the integrated circuit area. Although FIG. 2 illustrates twenty-four performance sensors, an integrated circuit implementation may include hundreds of performance sensors. The performance sensors may be, for example, serially connected to the core power reduction controller 225 or may be connected by a bus. At least some of the performance sensors include aging sensors.

Figure 3:
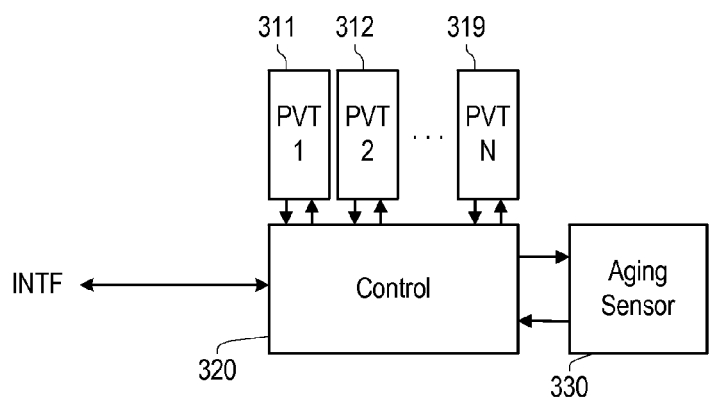
FIG. 3 is a functional block diagram of a performance sensor according to a presently disclosed embodiment.

FIG. 3 is a functional block diagram of a performance sensor according to a presently disclosed embodiment. The performance sensor may be used to implement the performance sensors 121, 122, 131, 141, 151, 152 of FIG. 1 and the performance sensors 261 of FIG. 2.

The performance sensor of FIG. 3 includes multiple PVT sensors 311-319. Each of the PVT sensors 311-319 measures a circuit performance, for example, by operating a ring oscillator to produce an output whose frequency is indicative of the circuit performance. Different ones of the PVT sensors 311-319 may measure performance of different types of circuits, for example, circuits with different type of transistors. The PVT sensors 311-319 may, for example, measure frequencies of ring oscillations formed of different types of circuits. The name PVT refers to process, voltage, and temperature, which are major influences on circuit performance.

The performance sensor includes an aging sensor 330. The aging sensor 330 can measure the effect of circuit aging. The aging sensor 330 may operate in an aging state where circuitry in the aging sensor 330 incurs aging. The aging sensor 330 may also operate in an aged oscillating state where measurements reflecting effects of aging can be made. The aging sensor 330 may also operate in an unaged oscillating state where measurements that do not reflect effects of aging can be made. The same transistors can be used in both the aged oscillating state and the unaged oscillating state.

The aging sensor 330 may include delay lines that can be controlled (e.g., by the core power reduction controller 111)

to be in the aging state, the aged oscillating state, or the unaged oscillating state. In an example embodiment, in the aging state, the delay lines are held in a static powered state. The delay lines are powered with the same supply voltage used by the circuit whose aging is to be sensed by the aging sensor. The delay lines may include a chain of inverting delay elements so that alternating ones of the delay elements have rising or falling output transitions with delays that are affected by circuit gaining.

In the aged oscillating state, the delay lines are coupled to produce a clock output that oscillates at a frequency based on delays of aged circuitry. Such measurements may be denoted $COUNT_{MAX\_AGING}$ and may be referred to as aged measurements. The delay lines can be coupled, for example, so the period of oscillation combines rising output transitions on delay elements whose rising output transitions are affected by aging with falling output transitions on delay elements whose falling output transitions are affected by aging.

In the unaged oscillating state, the delay lines are coupled to produce a clock output that oscillates at a frequency based on delays of unaged circuitry. Such measurements may be denoted $COUNT_{MIN\_AGING}$ and may be referred to as unaged measurements. The delay lines can be coupled, for example, so the period of oscillation combines falling output transitions on delay elements whose rising output transitions are affected by aging with rising output transitions on delay elements whose falling output transitions are affected by aging.

The difference between the measurement of the aged oscillating state ($COUNT_{MAX\_AGING}$) and the measurement of the unaged oscillating state ($COUNT_{MIN\_AGING}$) may be used as a measured amount of aging. Alternatively, the ratio of the measurements ($COUNT_{MAX\_AGING}/COUNT_{MIN\_AGING}$) may be used as a measured amount of aging. In another alternative, the percentage difference in the measurements $$\left(e.g., \frac{COUNT_{MIN\_AGING} - COUNT_{MAX\_AGING}}{COUNT_{MIN\_AGING}}\right)$$

may be used as the measured amount of aging.

The performance sensor includes a control module 320. The control module 320 provides an interface to other modules, for example, to the core power reduction controller 111 to communicate sensed performance measurements. The control module 320 may also include counters to count oscillations of the PVT sensors 311-319 and the aging sensor 330. The counters can count for a known time interval to measure frequencies of oscillators in the PVT sensors 311-319 or the aging sensor 330. The control module 320 may cause the voltage supply to the PVT sensors 311-319 to be removed when the PVT sensors 311-319 are not performing measurements. The aging sensor 330, however, remains powered during the aging state. Alternative performance sensors may omit the aging sensor or omit the PVT sensors.

Figure 4:
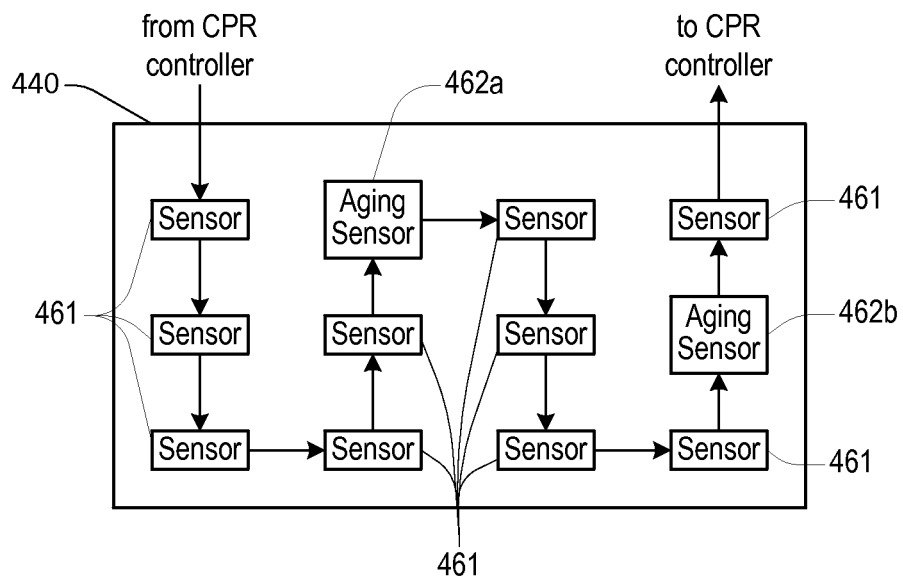
FIG. 4 is a layout block diagram of an integrated circuit module with performance and aging sensors according to a presently disclosed embodiment.

FIG. 4 is a layout block diagram of an integrated circuit module 440 with performance and aging sensors according to a presently disclosed embodiment. The integrated circuit module may be, for example, the processor module 220, the graphics processing module 230, or the modem module 240 of the integrated circuit of FIG. 2.

The integrated circuit module 440 includes performance sensors 461, a first aging sensor 462a, and a second aging sensor 462b (collectively aging sensors 462). The performance sensors 461 and aging sensors 462 may be implemented using variants of the performance sensor of FIG. 3. Although FIG. 4 illustrates ten performance sensors 461 and two aging sensors 462, other numbers of sensors may be used. Additionally, a performance sensor and an aging sensor may be collocated. In an embodiment, each sensor location includes a performance sensor and an aging sensor. In such cases, a subset of the sensor locations may be used to sense aging.

The performance sensors 461 and the aging sensors 462 may be distributed throughout the area of the integrated circuit module 440. The locations of the aging sensors 462 may be chosen to be at or near areas that will experience maximum aging. For example, the aging sensors 462 may be located at areas that will be at higher temperatures during operation of the integrated circuit. This can assure that the sensed aging at the hot locations is at least as large as the aging in other locations. Higher temperature locations may be selected based on simulated temperature mapping of the integrated circuit. Higher temperature locations may also be determined by physical measurements of an operating integrated circuit.

The use of only one or a few aging sensors in a supply domain can save time and power to measure the sensors and save integrated circuit area (e.g., for fuses) to store measurement results. Although circuit aging depends on operating conditions, such as temperature, voltage, and circuit activity, using a small number of aging sensors can be sufficient. The aging sensor or sensors can be arranged to reflect an amount of aging that is at least as much as other circuitry in the integrated circuit. By locating the aging sensors in hot areas, the temperature dependence of aging is maximized at the aging sensors. The aging sensor operates on the same voltage supply as operational circuitry; however, there may be small voltage variations (e.g., due to IR drops) between the operating circuitry and the aging sensor. Such voltage variations likely have minimal impact on aging but may be addressed by including aging sensors at worst-case supply voltage locations. By arranging the aging sensors to be held in a worst-case activity state (e.g., static biasing), activity based dependence of aging is maximized at the aging sensors.

Figure 5:
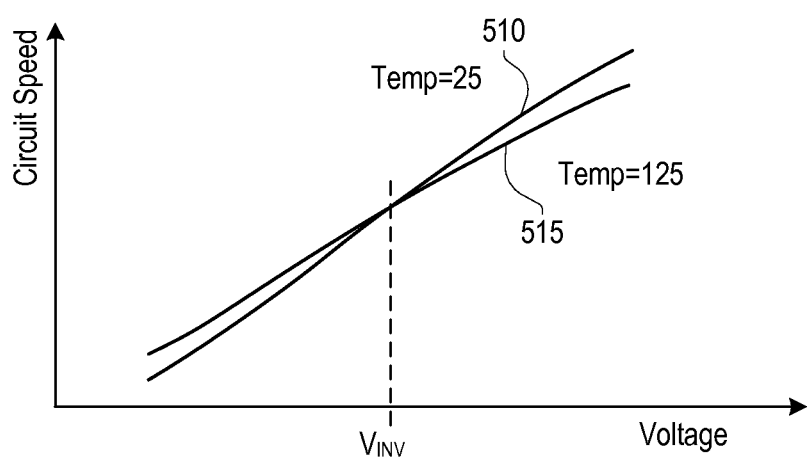
FIG. 5 is a graph of circuit speed versus supply voltage.

FIG. 5 is a graph of circuit speed versus supply voltage. The x-axis of the graph is supply voltage; the y-axis is circuit speed. The circuit speed may be, for example, a ring oscillator frequency.

A first curve 510 illustrates the relationship between the speed and supply voltage of a circuit at 25° C. A second curve 515 illustrates the relationship between the speed and supply voltage of the same circuit at 125° C. The first curve 510 is steeper than the second curve 515 due to a greater change in circuit speed with voltage at lower temperature.

The relationship between circuit speed and supply voltage is affected by various transistor characteristics. Some of the transistor characteristics change with temperatures. A first transistor characteristic that changes with temperatures is threshold voltage. Transistor threshold voltages decrease in magnitude as temperature increases. Decreased threshold voltages increase circuit speed. A second transistor characteristic that changes with temperatures is transconductance. Transistor transconductances decrease as temperature increases. Decreased transconductances decrease circuit speed. Thus, changes in threshold voltages increase circuit speed with increasing temperature and changes in transconductances decrease circuit speed with increasing temperature.

Which of the transistor characteristic temperature effects is greater depends on the supply voltage. The change in threshold voltage dominates at lower voltages. The change in transconductance dominates at higher voltages. At a certain supply voltage, the effect on circuit speed due to threshold voltage temperature dependence and the effect on circuit speed due to transconductance temperature dependence offset. At this voltage, termed the temperature inversion voltage, the circuit speed is independent (or substantially independent, e.g., the derivative of the speed-temperature relationship is zero but higher-order derivative are not zero) of temperature. The temperature inversion voltage $V_{INV}$ is illustrated in FIG. 5 where the first curve 510 and the second curve 515 intersect.

Measurements of circuit aging may be performed at the temperature inversion voltage to eliminate or reduce the effect of temperature on the measurements. Measuring circuit aging at the temperature inversion voltage is particularly practical in an integrated circuit with adaptive voltage scaling where the supply voltage is readily controllable. In contrast, controlling temperature outside a laboratory environment is not practical. In various embodiments, the measurements of circuit aging may be performed at supply voltages that are specific to each integrated circuit or at a supply voltage for a nominal integrated circuit. The measurements of circuit aging may be performed at supply voltages that vary from the temperature inversion voltage, for example, due to limited precision in controlling the supply voltage.

Figure 6:
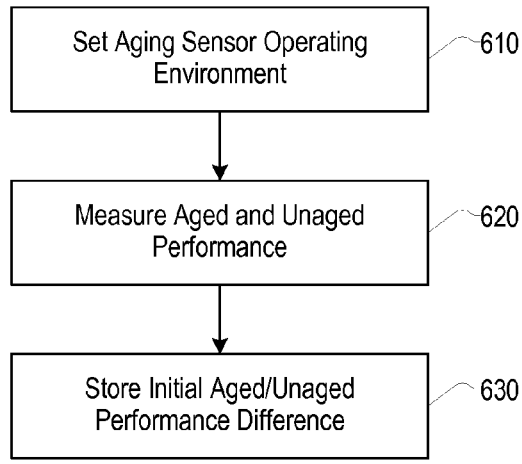
FIG. 6 is a flowchart of a process for determining an initial aging measurement according to a presently disclosed embodiment.

FIG. 6 is a flowchart of a process for determining an initial aging measurement according to a presently disclosed embodiment. The initial aging measurement can be used as a baseline measurement for aging compensation during operation of an integrated circuit. The process may be used with the integrated circuits and sensors described herein. The process may be performed during manufacturing testing of the integrated circuit.

In block 610, the process sets an operating environment for one or more aging sensors. The operating environment may be chosen to reduce or eliminate variations in aging sensor measurements due to non-aging effects. For example, the process may set a supply voltage to a value that is insensitive to other operating conditions, such as temperature. For example, the supply voltage may be set to the temperature inversion voltage so that aging measurements are insensitive to temperature.

In block 620, the process measures aging at the operating environment set in block 610. Measuring aging may include measuring the oscillating frequency of an aged circuit and the oscillating frequency of an unaged circuit. As described with reference to FIG. 3, the aged circuit and unaged circuit may be different configurations of the same circuitry.

In block 630, the process stores the aging measurement from block 620. The aging measurement may be stored in nonvolatile memory, such as fuses, antifuses, PROM devices, EPROM devices, and EEPROM devices. The nonvolatile memory may be located on the integrated circuit (e.g., in storage 112) containing the aging sensor. This can allow the initial aging measurement to be performed on a per integrated circuit basis rather than for an integrated circuit design or some other set of integrated circuits. The stored aging measurement may be the difference between the measurement of the aged oscillating state and the measurement of the unaged oscillating state. In an example embodiment, the measurements of the aged and unaged oscillating states have values near 1000 and the difference is stored as a signed 6-bit value.

The initial (before aging) measurements of the aged circuit and the unaged circuit are expected to produce the same values. However, differences in the aged and unaged measurements may occur, for example, due to manufacturing variations. The stored aging measurement can be used during operation of the integrated circuit to adjust later aging measurements for differences in the aged and unaged measurements not caused by aging.

The process of FIG. 6 may be performed for each voltage domain in an integrated circuit and for each aging sensor in an integrated circuit. Multiple sensors may be measured concurrently. Multiple domains may be measured concurrently.

The process of FIG. 6 may be modified by adding, omitting, reordering, or altering blocks. Additionally, blocks may be performed concurrently and a block that occurs after another block need not be immediately after.

Figure 7:
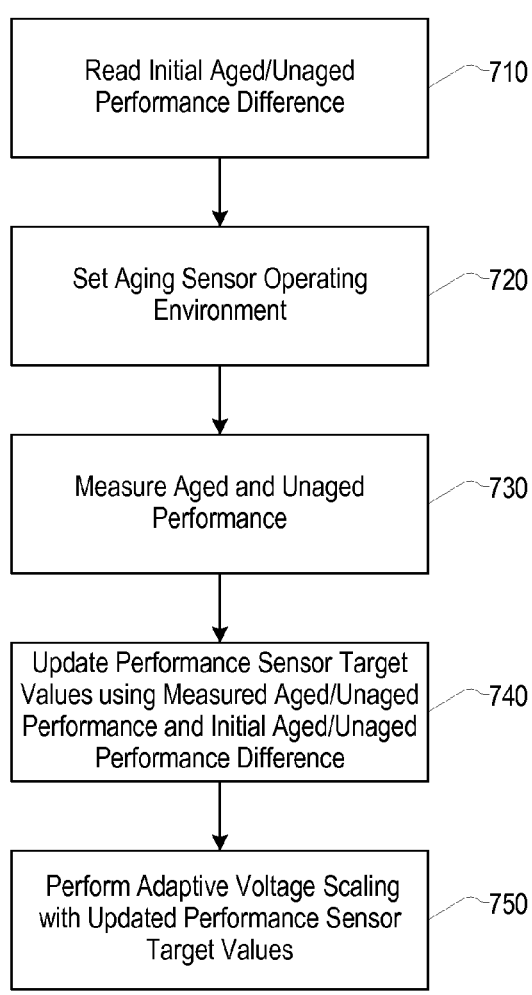
FIG. 7 is a flowchart of a process for adaptive voltage scaling with de-aging according to a presently disclosed embodiment.

FIG. 7 is a flowchart of a process for adaptive voltage scaling with de-aging according to a presently disclosed embodiment. The process may be used with the integrated circuits and sensors described herein. The process may be performed, for example, by the core power reduction controller 111 of the electronic system of FIG. 1. For clear explanation, the process is described for a single supply domain but it should be understood that the process can be used for de-aging of multiple supply domains.

In block 710, the process reads an initial aging measurement. The initial aging measurement may be read using various methods depending on the storage method. The initial aging measurement may be an initial aging measurement stored using the process of FIG. 6. In an embodiment, the initial aging measurement is the difference between the measurement of the aged oscillating state and the measurement of the unaged oscillating state of an aging sensor.

In block 720, the process sets an operating environment for one or more aging sensors. The operating environment may be chosen to reduce or eliminate variations in aging sensor measurements due to non-aging effects. For example, the process may set the supply voltage to the same supply voltage used to produce the initial aging measurement. The supply voltage may be set to a value that is insensitive to other operating conditions, such as temperature. For example, the supply voltage may be set to the temperature inversion voltage so that aging measurements are insensitive to temperature.

In block 730, the process measures aging at the operating environment set in block 720. The process measures the same aging sensor that was measured to produce the initial aging measurement. The measurement may be the same as or similar to the measurement of block 620 of the process of FIG. 6. In an integrated circuit with multiple aging sensors, the process may measure the aging sensors concurrently, individually, or in groups.

In block 740, the process updates one or more performance-sensor target values using the initial aging measurement from block 710 and the aging measurement from block 730. The performance sensor target values indicate performance sensor measurements that correspond to desired operations (e.g., at various frequencies) of particular modules.

The performance-sensor target values can be updated using an aging percentage that indicates an amount of change in circuit speed due to aging. The aging percentage may be calculated as $$AGING = \frac{(COUNT_{MIN\_AGING} - COUNT_{MAX\_AGING}) - AGING_{INITIAL}}{COUNT_{MIN\_AGING}},$$

where $COUNT_{MIN\_AGING}$ is the measured oscillating frequency of the aging sensor reflecting aging from block 730, $COUNT_{MAX\_AGING}$ is the measured oscillating frequency of the aging sensor not reflecting aging from block 730, and $AGING_{INITIAL}$ is the initial aging measurement from block 710 ($COUNT_{MIN\_AGING}$–$COUNT_{MAX\_AGING}$ before aging). If a calculated aging percentage is negative (e.g., due noise in the measurements), the calculated value can be replaced with zero. Additionally, the calculated aging percentage may be limited to a maximum value. When multiple aging sensors are measured, the aging percentage may be calculated for each sensor and the maximum value used to update the performance-sensor target values.

The aging percentage may also include a scale factor. The scale factor can account for differences between conditions under which the aging is measured and operating conditions associated with a particular performance-sensor target value. For example, if the operating conditions will have a different supply voltage than set in block 720, the aging percentage can be scaled to adjust for the different supply voltage.

The scale factors may be determined, for example, by simulation, analysis of sample integrated circuits, or analysis of the integrated circuit to which aging compensation is being applied. Additionally, scale factors may be estimated from transistor characteristics. For example, the scale factor may be calculated as $$(VDD_{COND}-V_t)/(VDD_{INV}-V_t),$$

where $VDD_{COND}$ is the supply voltage associated with the operating conditions associated with the performance-sensor target being value updated, $VDD_{INV}$ is the supply voltage set in block 720, and $V_t$ is a transistor threshold voltage.

The performance-sensor target values can then be updated using $$TARGET_{NEW}=TARGET_{INIT}\times(1+AGING),$$

where $TARGET_{NEW}$ is the updated performance-sensor target value and $TARGET_{INIT}$ is the initial performance-sensor target value. The above calculations may be modified for different measures of aging.

An example update of a performance-sensor target value is as follows. The initial aging measurement read in block 710 is $AGING_{INITIAL}=-20$. The aging measurements in block 730 are $COUNT_{MAX\_AGING}=980$ and $COUNT_{MIN\_AGING}=1000$. The calculated aging percentage is $AGING=(1000-980)-(-20)/1000=0.04$. With a scaling factor of 1 (or in an embodiment without scaling), performance-sensor target values are updated by multiplying the initial performance-sensor target values by 1.04.

In block 750, the process performs adaptive voltage scaling using the updated performance-sensor target values from block 740. The adaptive voltage scaling measures performance sensors and adjusts the supply voltage to move the measured performance toward the updated performance-sensor target values associated with the current operating conditions. For example, the current operating conditions may include clocking an operational circuit at 2 GHz. The associated updated performance-sensor target value may be 2080 indicating that performance sensor measurement should be 2080 for 2 GHz operation. If the measured performance is less than 2080, the process raises the supply voltage; if the measured performance is greater than 2080, the process lowers the supply voltage.

The process can return to blocks 710-740 to again update performance-sensor target values. The updates may be performed periodically, for example, hourly, daily, or weekly. The period between updates may change over time, for example, with less frequent updates as the integrated circuit ages. Additionally or alternatively, the process may update the performance-sensor target values based on operational events of the integrated circuit. For example, the updates may occur when the integrated circuit is initialized or when the integrated circuit switches from an operating mode to a standby mode.

The process of FIG. 7 may be modified by adding, omitting, reordering, or altering blocks. Additionally, blocks may be performed concurrently and a block that occurs after another block need not be immediately after.

Although particular embodiments are described above, many variations are possible. For example, the numbers of various components may be increased or decreased. The described systems and methods may be modified depending upon the particular aging effects that are important in an integrated circuit. The aging sensor may be tailored according to the specific fabrication technology of an integrated circuit. An integrated circuit may contain multiple aging sensors to measure multiple aging effects. Additionally, features of the various embodiments may be combined in combinations that differ from those described above.

Those of skill will appreciate that the various illustrative blocks and modules described in connection with the embodiments disclosed herein can be implemented in various forms. Some blocks and modules have been described above generally in terms of their functionality. How such functionality is implemented depends upon the design constraints imposed on an overall system. Skilled persons can implement the described functionality in varying ways for each particular application. In addition, the grouping of functions within a module or block is for ease of description. Specific functions can be moved from one module or block or distributed across to modules or blocks.

The various illustrative logical blocks and modules described in connection with the embodiments disclosed herein can be implemented or performed with a general purpose processor, a digital signal processor (DSP), application specific integrated circuit (ASIC), a field programmable gate array (FPGA) or other programmable logic device, discrete gate or transistor logic, discrete hardware components, or any combination thereof designed to perform the functions described herein. A general-purpose processor can be a microprocessor, but in the alternative, the processor can be any processor, controller, microcontroller, or state machine. A processor can also be implemented as a combination of computing devices, for example, a combination of a DSP and a microprocessor, a plurality of microprocessors, one or more microprocessors in conjunction with a special-purpose circuitry, or any other such configuration.

The steps of a method or algorithm described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of storage medium. An exemplary storage medium can be coupled to the processor such that the processor can read information from, and write information to, the storage medium. In the alternative, the storage medium can be integral to the processor. The processor and the storage medium can reside in an ASIC.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent a presently preferred embodiment of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

What is claimed is:

1. A method for compensating for circuit aging in an integrated circuit, the method comprising:
   setting an operating environment for an aging sensor disposed on the integrated circuit;
   measuring the aging sensor at the operating environment to determine a measured aging;
   updating a target value for a performance sensor using the measured aging and an initial aging measurement value; and
   performing adaptive voltage scaling using the updated target value.

2. The method of claim 1, wherein the operating environment is selected to reduce impacts of non-aging effects on the measured aging.

3. The method of claim 1, wherein setting the operating environment includes setting a supply voltage for the aging sensor to a first voltage level.

4. The method of claim 3, wherein the first voltage level is a temperature inversion voltage at which circuit speed is substantially independent of temperature.

5. The method of claim 1, further comprising reading the initial aging measurement value from a nonvolatile memory disposed on the integrated circuit.

6. The method of claim 1, wherein the measured aging includes an aged measurement indicative of circuit speed reflecting circuit aging and an unaged measurement indicative of circuit speed not reflecting circuit aging.

7. The method of claim 6, wherein the initial aging measurement value is the difference between an initial aged measurement and an initial unaged measurement, and
   wherein the initial aged measurement and the initial unaged measurement are measurements of the aging sensor at the operating environment obtained during manufacturing of the integrated circuit.

8. The method of claim 6, wherein updating the target value includes multiplying an initial target value by one plus an aging percentage calculated using the aged measurement, the unaged measurement, and the initial aging measurement value.

9. The method of claim 8, wherein the initial aging measurement value is the difference between an initial aged measurement and an initial unaged measurement, and wherein the aging percentage is calculated as a ratio of the unaged measurement minus the aged measurement minus the initial aging measurement value to the unaged measurement.

10. The method of claim 1, wherein the aging sensor is disposed at a location on the integrated circuit expected to operate at higher temperature than other locations on the integrated circuit.

11. An integrated circuit, comprising:
    an aging sensor configured to supply a measured aging; and
    a core power reduction controller configured to
       set an operating environment for the aging sensor,
       receive, from the aging sensor, the measured aging at the operating environment,
       update a target value for a performance sensor using the measured aging and an initial aging measurement value, and
       perform adaptive voltage scaling using the updated target value.

12. The integrated circuit of claim 11, wherein the operating environment is selected to reduce impacts of non-aging effects on the measured aging.

13. The integrated circuit of claim 11, wherein the core power reduction controller is further configured to set the operating environment by setting a supply voltage for the aging sensor to a first voltage level.

14. The integrated circuit of claim 13, wherein the first voltage level is a temperature inversion voltage at which circuit speed is substantially independent of temperature.

15. The integrated circuit of claim 11, further comprising a nonvolatile memory, and wherein the core power reduction controller is further configured to read the initial aging measurement value from the nonvolatile memory.

16. The integrated circuit of claim 11, wherein the measured aging includes an aged measurement indicative of circuit speed reflecting circuit aging and an unaged measurement indicative of circuit speed not reflecting circuit aging.

17. The integrated circuit of claim 16, wherein the core power reduction controller is further configured to update the target value by multiplying an initial target value by one plus an aging percentage calculated using the aged measurement, the unaged measurement, and the initial aging measurement value.

18. The integrated circuit of claim 17, wherein the initial aging measurement value is the difference between an initial aged measurement and an initial unaged measurement, and wherein the aging percentage is calculated as a ratio of the unaged measurement minus the aged measurement minus the initial aging measurement value to the unaged measurement.

19. The integrated circuit of claim 11, wherein the aging sensor is disposed at a location on the integrated circuit expected to operate at higher temperature than other locations on the integrated circuit.

20. An integrated circuit, comprising:
    a means for sensing aging of circuitry in the integrated circuit that supplies a measured aging; and
    a means for core power reduction configured to
       set an operating environment for the means for sensing aging,
       receive, from the means for sensing aging, the measured aging at the operating environment,
       update a target value for a performance sensor using the measured aging and an initial aging measurement value, and
       perform adaptive voltage scaling using the updated target value.

21. The integrated circuit of claim 20, wherein the operating environment is selected to reduce impacts of non-aging effects on the measured aging.

22. The integrated circuit of claim 20, wherein the means for core power reduction is further configured to set the operating environment by setting a supply voltage for the means for sensing aging to a first voltage level.

23. The integrated circuit of claim 22, wherein the first voltage level is a temperature inversion voltage at which circuit speed is substantially independent of temperature.

24. The integrated circuit of claim 20, wherein the means for core power reduction is further configured to read the initial aging measurement value from a nonvolatile memory disposed on the integrated circuit.

25. The integrated circuit of claim 20, wherein the measured aging includes an aged measurement indicative of circuit speed reflecting circuit aging and an unaged measurement indicative of circuit speed not reflecting circuit aging.

26. The integrated circuit of claim 25, wherein the means for core power reduction is further configured to update the target value by multiplying an initial target value by one plus an aging percentage calculated using the aged measurement, the unaged measurement, and the initial aging measurement value.

27. The integrated circuit of claim 26, wherein the initial aging measurement value is the difference between an initial aged measurement and an initial unaged measurement, and wherein the aging percentage is calculated as a ratio of the unaged measurement minus the aged measurement minus the initial aging measurement value to the unaged measurement.

28. The integrated circuit of claim 20, wherein the means for sensing aging is disposed at a location on the integrated circuit expected to operate at higher temperature than other locations on the integrated circuit.

\* \* \* \* \*